United States Patent
Pham et al.

(10) Patent No.: US 6,248,627 B1
(45) Date of Patent: Jun. 19, 2001

(54) METHOD FOR PROTECTING GATE EDGES FROM CHARGE GAIN/LOSS IN SEMICONDUCTOR DEVICE

(75) Inventors: Tuan D. Pham, Santa Clara; Mark T. Ramsbey, Sunnyvale; Sameer S. Haddad, San Jose; Angela T. Hui, Fremont; Yu Sun, Saratoga; Chi Chang, Redwood City, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/376,658

(22) Filed: Aug. 18, 1999

(51) Int. Cl.[7] ................. H01L 21/336; H01L 21/8236; H01L 21/3205; H01L 29/78; H01L 29/94

(52) U.S. Cl. ................. 438/257; 438/286; 438/543; 438/264; 438/265; 257/316

(58) Field of Search .................. 438/257, 201, 438/276, 211, 258, 260, 266, 595, 303, 231; 257/336

(56) References Cited

U.S. PATENT DOCUMENTS

| | | | |
|---|---|---|---|
| 4,766,088 | * 8/1988 | Kono et al. | 437/52 |
| 4,852,062 | * 7/1989 | Baker et al. | 365/185 |
| 4,981,810 | * 1/1991 | Fazan et al. | 437/44 |
| 5,445,984 | * 8/1995 | Hong et al. | 437/43 |
| 5,661,054 | * 8/1997 | Kauffman et al. | 438/257 |
| 5,736,442 | * 4/1998 | Mori | 438/257 |
| 5,898,189 | * 4/1999 | Gardner et al. | 257/661 |
| 5,907,779 | * 5/1999 | Choi | 438/279 |
| 5,926,707 | * 8/1988 | Seo | 438/238 |
| 5,963,824 | * 8/1988 | Krivokapic | 438/593 |

* cited by examiner

Primary Examiner—Olik Chaudhuri
Assistant Examiner—Shrinivas H. Rao
(74) Attorney, Agent, or Firm—Lariviere, Grubman & Payne, LLP

(57) ABSTRACT

A method for making a ULSI MOSFET includes covering core gate stacks with a first protective layer, etching away the first layer such that intended source regions of the substrate are exposed, and implanting dopant into the source regions. A second protective layer is then deposited over the first layer and is etched back to conform to the first layer, covering only the sides of the gate stacks, and exposing intended drain regions of the substrate. Dopant is then implanted into the drain regions. During subsequent manufacturing steps including ILD formation and metallization, mobile ions and other process-induced charges are blocked from entering the floating gates of the gate stacks by the protective layers, thereby preventing unwanted charge gain/loss.

14 Claims, 2 Drawing Sheets

US 6,248,627 B1

METHOD FOR PROTECTING GATE EDGES FROM CHARGE GAIN/LOSS IN SEMICONDUCTOR DEVICE

TECHNICAL FIELD

The present invention relates generally to fabricating semiconductor memory devices such as EEPROM or flash EEPROM, and more particularly to methods for reducing mobile ion migration into transistor gate sides during semiconductor manufacturing.

BACKGROUND OF THE INVENTION

Semiconductor chips or wafers are used in many applications, including as integrated circuits and as flash memory for hand held computing devices, wireless telephones, and digital cameras. A common circuit component of flash memory devices is the transistor. In these devices, a transistor is established by forming a gate stack including a control gate and a floating gate on a silicon substrate, and then forming a source region and a drain region in the substrate beneath the gate stack by implanting ion dopants into the areas of the substrate that are to become the source and drain regions. This generally-described structure cooperates to function as a transistor.

After the gate stacks have been formed, subsequent manufacturing steps are undertaken to complete the semiconductor device. These subsequent steps include, among other things, the formation of additional layers of transistors along with interlayer dielectrics (ILD), followed by metallization and external electrical contact formation. It happens, however, that during these subsequent steps, mobile ions and/or other processed-induced charges can migrate into the sides of the floating gate, which undesirably can alter an electrical characteristic of the device, such as the threshold voltage or current, from its design value. This in turn adversely affects the reliability of the transistor. The present invention recognizes this prior art drawback and provides the below-noted solutions.

BRIEF SUMMARY OF THE INVENTION

A method is disclosed for establishing plural core gate transistors on a semiconductor substrate. The method includes forming plural core gate stacks on the substrate. The core gate stacks are covered with a first protective layer, portions of which are etched away such that at least intended source regions of the substrate are exposed. Dopant is next implanted into the intended source regions. A second protective layer made of nitride or silicon oxynitride (SiON) is deposited onto the first layer and portions etched away such that at least intended drain portions of the substrate are exposed. Then, dopant is implanted into the intended drain regions to thereby establish plural core transistors. Subsequent manufacturing acts can be undertaken with the first and second layers protecting at least the sides of the core gate stacks from ion migration and, hence, from unwanted charge gain or loss from the floating gate of the gate stack.

In a preferred embodiment, periphery gates are formed on the substrate, and the periphery stacks are covered with the first protective layer. However, etching away of the first protective layer on the periphery gates is prevented during the act of etching away portions of the first layer to expose the intended source regions.

As intended in the preferred embodiment, the first and second layers cover only the sides of the core gate stacks after the second etching act, as well as portions of the periphery gates. The first protective layer can have a thickness of between three hundred Angstroms (300 Å) and one thousand Angstroms (1000 Å) immediately subsequent to forming the first protective layer, and it can be made of a variety of materials such as nitride, SiON, etc.

As set forth in greater detail below, each core gate stack includes a source side and a drain side, and the protective layers on the source sides are thinner than the protective layers on the drain sides. Moreover, the protective layers on the source sides are shorter than the protective layers on the drain sides. A semiconductor device made according to the present method, as well as a computer incorporating the device, are also disclosed.

In another aspect, a method for making a flash memory device includes forming first and second protective shoulders on core gate stacks, such that dopant can be implanted into a substrate supporting the stacks to establish transistors. Charge migration into sides of the gate stacks during interlayer dielectric (ILD) formation and device metallization is prevented, however, by the protective shoulders.

In still another aspect, a semiconductor device includes plural gate stacks, each defining a source side and a drain side. The device also includes inner and outer protective shoulders on both sides of the stacks, whereby migration of charges into the sides is impeded.

Other features of the present invention are disclosed or apparent in the section entitled "DETAILED DESCRIPTION OF THE INVENTION".

DETAILED DESCRIPTION OF THE INVENTION

Figure 1:
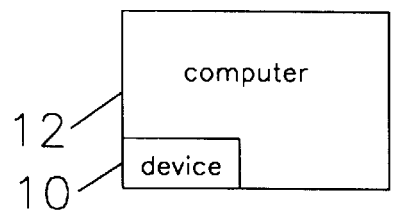
FIG. 1 is a schematic diagram of a semiconductor device made according to the present invention, shown in combination with a digital processing apparatus.

Referring initially to FIG. 1, a semiconductor device 10 is shown incorporated into a digital processing apparatus such as a computer 12. The device 10 is made in accordance with the below disclosure.

Figure 2:
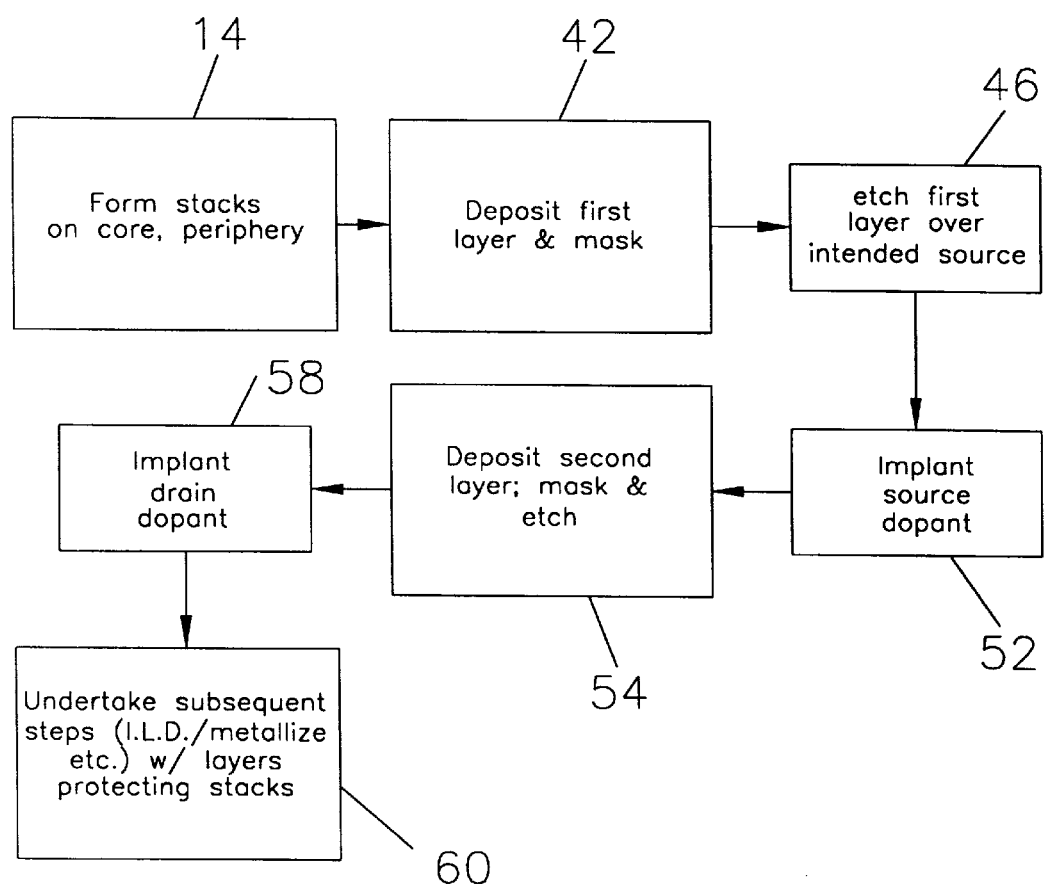
FIG. 2 is a flow chart showing the steps of the present invention.
Figure 3:
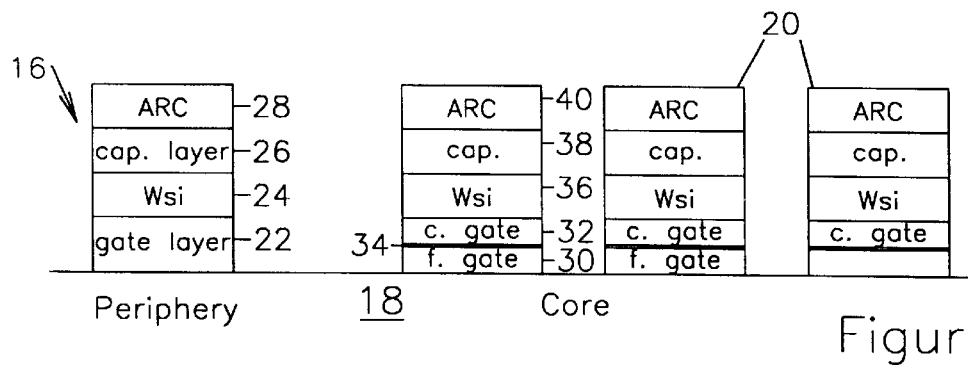
FIG. 3 is a side view showing gate stacks in the periphery region and core region, prior to formation of the source and drain regions below the gate stacks.

Now referring to FIGS. 2 and 3, as indicated at block 14 in FIG. 2 and as shown in FIG. 3, periphery gates 16 are formed on a semiconductor substrate 18 around core area gate stacks 20 in accordance with principles known in the art. In one preferred embodiment, each periphery gate 16 includes a respective polysilicon "2" layer 22 that supports a tungsten silicide layer 24, labelled "$W_{si}$" in FIG. 3. On top of the tungsten silicide layer 24 is a capping layer 26, preferably made of polysilicon, and on top of that, an anti-reflective coating layer 28 such as silicon oxynitride (SiON) or nitride.

In contrast to the periphery gates 16, each core gate stack 20 includes a respective floating gate 30 and a control gate 32 disposed above the floating gate 30, with a very thin layer 34 of, e.g., oxide nitride oxide (ONO) sandwiched therebetween. The gates 30, 32 can be made of polysilicon. On top of the control gate 32 is a tungsten silicide layer 36 and a polysilicon cap layer 38, and on top of that, a silicon oxynitride (SiON) layer 40.

As is known in the art, very thin oxide layers (not shown in the Figures) can be sandwiched between the substrate 18 and periphery gates 16 and core gate stacks 20. Also, the gate stacks 16, 20 can be covered with a thin oxide layer, also not shown but discussed here for completeness.

Figure 4:
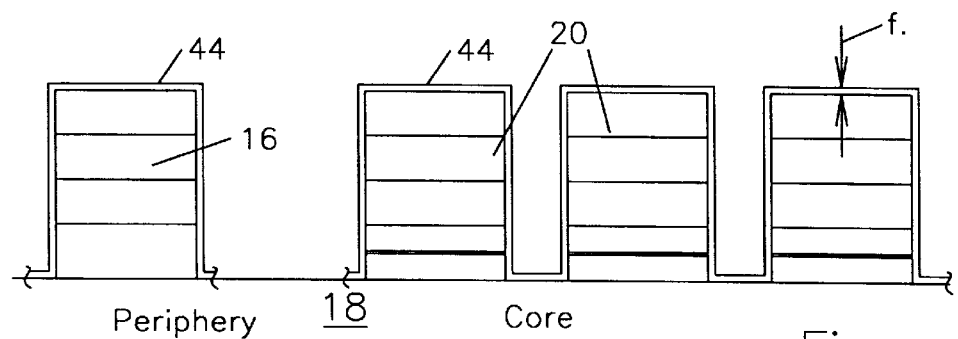
FIG. 4 is a side view showing the gate stacks after deposition of the first protective layer.

Having thus set forth one preferred configuration of gate stacks 16, 20, attention is now drawn to block 42 of FIG. 2 and to FIG. 4. A first protective layer 44 is deposited over the gate stacks 16, 20 as shown in FIG. 4. In the presently preferred embodiment, the first protective layer 44 is made of nitride or SiON or other appropriate charge-blocking material. The first layer 44 preferably is deposited using plasma deposition principles, although other methods of deposition (e.g., chemical vapor deposition (CVD), low pressure CVD, PECVD) can be used. As envisioned in one embodiment of the present invention, the first protective layer 44 has a thickness "$t_1$" of between three hundred Angstroms (300 Å) and one thousand Angstroms (1000 Å).

Figure 5:
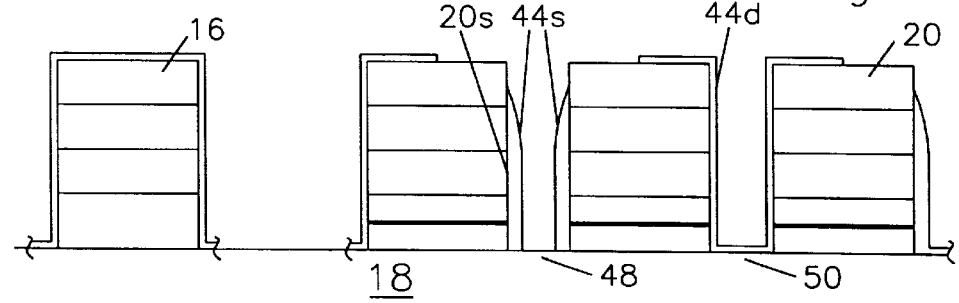
FIG. 5 is a side view showing the gate stacks after the first layer is partially etched back over the regions into which source dopant is to be implanted.

A photoresist mask is next deposited over areas of the device 10 that are not to function as source dopant implantation regions, as also indicated at block 42 of FIG. 2. Proceeding to block 46 of FIG. 2 and now referring to FIG. 5, the first protective layer 44 is partially etched back over the core stacks 20 using wet or dry chemical etch principles, with the photoresist layer masking certain regions of the device 10. More particularly, source side portions of the first layer 44, i.e., the portions that cover intended source regions 48 in the substrate 18, are etched away, with drain side portions $44_d$ of the first layer 44 that cover intended drain regions 50 being masked by the photoresist as shown. However, source side portions $44_s$ of the first layer 44 that cover the source sides $20_s$ of the core gate stacks 20 remain in the shoulder configuration shown. Although not envisioned in the preferred embodiment, the masking and implantation order of the source and drain regions can be reversed if desired.

Moving to block 52 of FIG. 2, dopant is implanted into the now-exposed source regions 48. The source dopant, however, is masked from the stacks 16, 20 and intended drain regions 50 by the first protective layer 44.

Figure 6:
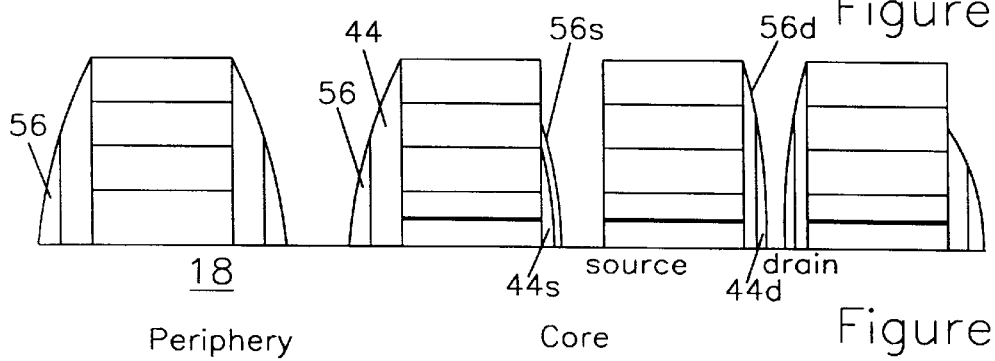
FIG. 6 is a side view showing the gate stacks after deposition and etch-back of the second protective layer.

At block 54 of FIG. 2, and now referring to FIG. 6, a second protective layer 56 is deposited over the first protective layer 44 over both the periphery gates 16 and core gate stacks 20, and then both layers 44, 56 are etched back to the configuration shown in FIG. 6. Specifically, the second layer 56 conforms to the first layer 44. Accordingly, source side portions $56_s$ of the second layer 56 and the source side portions $44_s$ of the first layer 44 are shorter and thinner (looking down on FIG. 6) than drain side portions $56_d$, $44_d$ of the respective layers 56, 44, with both protective layers 44, 56 after etching covering the sides of the periphery and core gate stacks 16, 20 but not the tops thereof. In one preferred embodiment, the second protective layer 56 is made of nitride or SiON.

Completing the description of FIG. 2, at block 58 drain dopant is implanted into the now-exposed drain regions 50. Then, at block 60, subsequent manufacturing steps including ILD deposition and metallization can be undertaken, with mobile ions and/or other process-induced charges being blocked from entering the sides of the gate stacks 16, 20 by the protective layers 44, 56. Consequently, unwanted charge gain and/or loss from the gate stacks 16, 20 and other transistor characteristic changes are prevented.

While the particular METHOD FOR PROTECTING GATE EDGES FROM CHARGE GAIN/LOSS IN SEMICONDUCTOR DEVICE as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". Indeed, although a single transistor structure is shown in the drawings for clarity, the skilled artisan will appreciate that the chip 10 can include plural transistors, each substantially identical to that shown, as well as other circuit components. All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for".

What is claimed is:

1. A method for establishing plural core gate transistors on a semiconductor substrate, comprising:
   forming plural core gate stacks on the substrate, each core gate stack having at least one side;
   covering the core gate stacks with a first protective layer;
   etching away portions of the first layer such that at least intended source regions but not drain regions of the substrate are exposed;
   implanting dopant into the intended source regions but not the drain regions;
   depositing a second protective layer onto the first layer, the second protective layer including nitride or SiON;
   etching the second protective layer such that at least intended drain portions of the substrate are exposed; and
   implanting dopant into the intended drain regions.

2. The method of claim 1, further comprising:
   forming plural periphery gates on the substrate;
   covering the periphery gates with the first protective layer; and
   preventing etching away of the first protective layer over the periphery gates during the act of etching away portions of the first layer to expose the intended source regions.

3. The method of claim 2, wherein the first and second layers cover only the sides of the core gate stacks after the second etching act, as well as portions of the periphery gates.

4. The method of claim 1, wherein the first protective layer has a thickness of between three hundred Angstroms (300 Å) and one thousand Angstroms (1000 Å) immediately subsequent to forming the first protective layer.

5. The method of claim 1, wherein the first protective layer is made of nitride or SiON.

6. The method of claim 3, wherein each core gate stack includes a source side and a drain side, and the protective layers on the source sides are thinner than the protective layers on the drain sides.

7. The method of claim 3, wherein each core gate stack includes a source side and a drain side, and the protective layers on the source sides are shorter than the protective layers on the drain sides.

8. A method for making a flash memory device, comprising forming first and second protective shoulders on core gate stacks, such that dopant can be implanted sequentially into source and drain regions of a substrate supporting the stacks to establish transistors and such that charge migration into sides of the gate stacks during interlayer dielectric (ILD) formation and device metallization is prevented, atleast the second shoulder including nitride or SiON;

covering the core gate stacks with a first protective layer;

etching away portions of the first layer such that at least intended source regions of the substrate are exposed;

implanting dopant into the intended source regions;

depositing a second layer protective layer onto the first layer, the second protective layer including nitride or SiON; and etching the second protective layer such that at least intended drain portions of the substrate are exposed.

9. The method of claim 8, further comprising:

forming plural periphery gates on the substrate;

covering the periphery gates with the first protective layer; and preventing etching away of the first protective layer over the periphery gates during the act of etching away portions of the first layer to expose the intended source regions.

10. The method of claim 9, wherein the first and second layers cover only the sides of the core gate stacks after the second etching act, as well as portions of the periphery gates.

11. The method of claim 8, wherein the first protective layer has a thickness of between three hundred Angstroms (300 Å) and one thousand Angstroms (1000 Å).

12. The method of claim 8, wherein the first protective layer is made of nitride or SiON.

13. The method of claim 10, wherein each core gate stack includes a source side and a drain side, and the protective layers on the source sides are thinner than the protective layers on the drain sides.

14. The method of claim 10, wherein each core gate stack includes a source side and a drain side, and the protective layers on the source sides are shorter than the protective layers on the drain sides.

* * * * *

UNITED STATES PATENT AND TRADEMARK OFFICE
CERTIFICATE OF CORRECTION

PATENT NO. : 6,248,627 B1
DATED : June 19, 2001
INVENTOR(S) : Tuan D. Pham, Mark T. Ramsbey, Sameer S. Haddad, Angela T. Hui, Yu Sun, Chi Chang It is certified that error appears in the above-identified patent and that said Letters Patent is hereby corrected as shown below:

Column 5,
Line 16, after the word "source" add -- regions --

Signed and Sealed this

Eleventh Day of December, 2001

Attest:

Nicholas P. Godici

NICHOLAS P. GODICI
Attesting Officer
Acting Director of the United States Patent and Trademark Office